(12) United States Patent
Sankman et al.

(10) Patent No.: US 12,387,999 B2
(45) Date of Patent: *Aug. 12, 2025

(54) PLANAR INTEGRATED CIRCUIT PACKAGE INTERCONNECTS

(71) Applicant: Intel Corporation, Santa Clara, CA (US)

(72) Inventors: Robert L. Sankman, Phoenix, AZ (US); Sanka Ganesan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/592,887

(22) Filed: Feb. 4, 2022

(65) Prior Publication Data

US 2022/0157701 A1 May 19, 2022

Related U.S. Application Data

(63) Continuation of application No. 16/842,954, filed on Apr. 8, 2020, now Pat. No. 11,276,630, which is a
(Continued)

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01); *H01L 21/565* (2013.01);
(Continued)

(58) Field of Classification Search
CPC ......... H01L 23/49811; H01L 23/49822; H01L 23/49838; H01L 23/3114; H01L 21/4853;
(Continued)

(56) References Cited

U.S. PATENT DOCUMENTS 10,651,116 B2 * 5/2020 Sankman ............ H01L 21/4853
11,276,630 B2 * 3/2022 Sankman ................ H01L 24/13
(Continued)

FOREIGN PATENT DOCUMENTS

CN 102197478 9/2011
EP 2958141 A1 12/2015
(Continued)

OTHER PUBLICATIONS

"European Application Serial No. 17820867.4, Communication Pursuant to Article 94(3) EPC mailed Feb. 14, 2022", 6 pgs.
(Continued)

*Primary Examiner* — Nathan W Ha
(74) *Attorney, Agent, or Firm* — Akona IP PC

(57) ABSTRACT

Generally discussed herein are systems, methods, and apparatuses that include conductive pillars that are about coplanar. According to an example, a technique can include growing conductive pillars on respective exposed landing pads of a substrate, situating molding material around and on the grown conductive pillars, removing, simultaneously, a portion of the grown conductive pillars and the molding material to make the grown conductive pillars and the molding material about planar, and electrically coupling a die to the conductive pillars.

20 Claims, 10 Drawing Sheets

Related U.S. Application Data continuation of application No. 15/198,107, filed on Jun. 30, 2016, now Pat. No. 10,651,116.

(51) Int. Cl.
  *H01L 21/56* (2006.01)
  *H01L 23/00* (2006.01)
  *H01L 23/31* (2006.01)

(52) U.S. Cl.
  CPC .. *H01L 23/49827* (2013.01); *H01L 23/49838* (2013.01); *H01L 24/09* (2013.01); *H01L 24/13* (2013.01); *H01L 24/16* (2013.01); H01L 23/3114 (2013.01); H01L 23/49822 (2013.01); H01L 24/81 (2013.01); H01L 2224/08238 (2013.01); H01L 2224/131 (2013.01); H01L 2224/13294 (2013.01); H01L 2224/133 (2013.01); H01L 2224/16237 (2013.01); H01L 2224/16238 (2013.01); H01L 2224/81191 (2013.01); H01L 2224/81192 (2013.01); H01L 2224/81401 (2013.01); H01L 2224/81411 (2013.01); H01L 2224/81416 (2013.01); H01L 2224/81438 (2013.01); H01L 2224/81439 (2013.01); H01L 2224/81444 (2013.01); H01L 2224/81447 (2013.01); H01L 2224/81455 (2013.01); H01L 2224/81464 (2013.01); H01L 2224/81473 (2013.01); H01L 2224/81815 (2013.01); H01L 2924/01004 (2013.01); H01L 2924/01028 (2013.01); H01L 2924/01029 (2013.01); H01L 2924/01045 (2013.01); H01L 2924/01046 (2013.01); H01L 2924/01047 (2013.01); H01L 2924/01048 (2013.01); H01L 2924/0105 (2013.01); H01L 2924/01079 (2013.01); H01L 2924/01082 (2013.01); H01L 2924/14 (2013.01); H01L 2924/1532 (2013.01); H01L 2924/15747 (2013.01)

(58) Field of Classification Search
  CPC ....... H01L 21/565; H01L 24/09; H01L 24/13; H01L 23/49827; H01L 24/16; H01L 24/81; H01L 2224/08238; H01L 2224/131; H01L 2224/13294; H01L 2224/133; H01L 2224/16237; H01L 2224/16238; H01L 2224/81191; H01L 2224/81192; H01L 2224/81401; H01L 2224/81411; H01L 2224/81416; H01L 2224/81438; H01L 2224/81439; H01L 2224/81444; H01L 2224/81447; H01L 2224/81455; H01L 2224/81464; H01L 2224/81473; H01L 2224/81815; H01L 2924/01004; H01L 2924/01028; H01L 2924/01029; H01L 2424/01045; H01L 2924/01046; H01L 2924/01047; H01L 2924/01048; H01L 2924/0105; H01L 2924/01079; H01L 2924/01082; H01L 2924/14; H01L 2924/1532; H01L 2924/15747; H01L 2224/41839; H01L 2924/00014; H01L 2924/014; Y02P 80/30
  USPC ...................................................... 257/698
  See application file for complete search history.

(56) References Cited

U.S. PATENT DOCUMENTS

| | | |
|---|---|---|
| 2011/0169150 A1 | 7/2011 | Su et al. |
| 2011/0316117 A1 | 12/2011 | Kripesh et al. |
| 2012/0086120 A1 | 4/2012 | Chen et al. |
| 2012/0205800 A1 | 8/2012 | Shen et al. |
| 2014/0036454 A1 | 2/2014 | Caskey et al. |
| 2015/0048503 A1 | 2/2015 | Chiu et al. |
| 2015/0366064 A1 | 12/2015 | Hsu et al. |
| 2016/0005685 A1 | 1/2016 | Rokugawa |
| 2016/0013147 A1 | 1/2016 | Cheng et al. |
| 2016/0118312 A1 | 4/2016 | Hu et al. |
| 2016/0118333 A1 | 4/2016 | Lin |
| 2018/0005928 A1 | 1/2018 | Sankman et al. |
| 2020/0235047 A1 | 7/2020 | Sankman et al. |

FOREIGN PATENT DOCUMENTS

| | | |
|---|---|---|
| EP | 2996146 A1 | 3/2016 |
| WO | WO-2018005006 A8 | 11/2018 |

OTHER PUBLICATIONS

"European Application Serial No. 17820867.4, Response filed May 17, 2022 to Communication Pursuant to Article 94(3) EPC mailed Feb. 14, 2022", 13 pgs.

"Chinese Application Serial No. 201780034003.9, Office Action mailed Oct. 26, 2022", With English translation, (24 pgs).

"Chinese Application Serial No. 201780034003.9, Response filed Mar. 8, 2023 to Office Action mailed Oct. 26, 2022", w English claims, 20 pgs.

"U.S. Appl. No. 15/198,107, Corrected Notice of Allowability mailed Mar. 6, 2020", 4 pgs.

"U.S. Appl. No. 15/198,107, Corrected Notice of Allowability mailed Apr. 15, 2020", 6 pgs.

"U.S. Appl. No. 15/198,107, Non Final Office Action mailed Aug. 6, 2019", 9 pgs.

"U.S. Appl. No. 15/198,107, Notice of Allowance mailed Jan. 10, 2020", 7 pgs.

"U.S. Appl. No. 15/198,107, Response filed Oct. 14, 2019 to Non-Final Office Action mailed Aug. 6, 2019", 9 pgs.

"U.S. Appl. No. 16/842,954, Non Final Office Action mailed Apr. 1, 2021", 7 pgs.

"U.S. Appl. No. 16/842,954, Notice of Allowance mailed Nov. 4, 2021", 10 pgs.

"U.S. Appl. No. 16/842,954, Response filed Jun. 24, 2021 to Non Final Office Action mailed Apr. 1, 2021", 6 pgs.

"European Application Serial No. 17820867.4, Extended European Search Report mailed Jan. 30, 2020", 9 pgs.

"European Application Serial No. 17820867.4, Response filed Jul. 31, 2020 to Extended European Search Report mailed Jan. 30, 2020", 10 pgs.

"International Application Serial No. PCT/US2017/035795, International Search Report mailed Aug. 31, 2017", 3 pgs.

"International Application Serial No. PCT/US2017/035795, Written Opinion mailed AUg. 31, 2017", 8 pgs.

U.S. Appl. No. 15/198,107 U.S. Pat. No. 10,651,116, filed Jun. 30, 2016, Planar Integrated Circuit Package Interconnects.

U.S. Appl. No. 16/842,954 U.S. Pat. No. 11,276,630, filed Apr. 8, 2020, Planar Integrated Circuit Package Interconnects.

\* cited by examiner

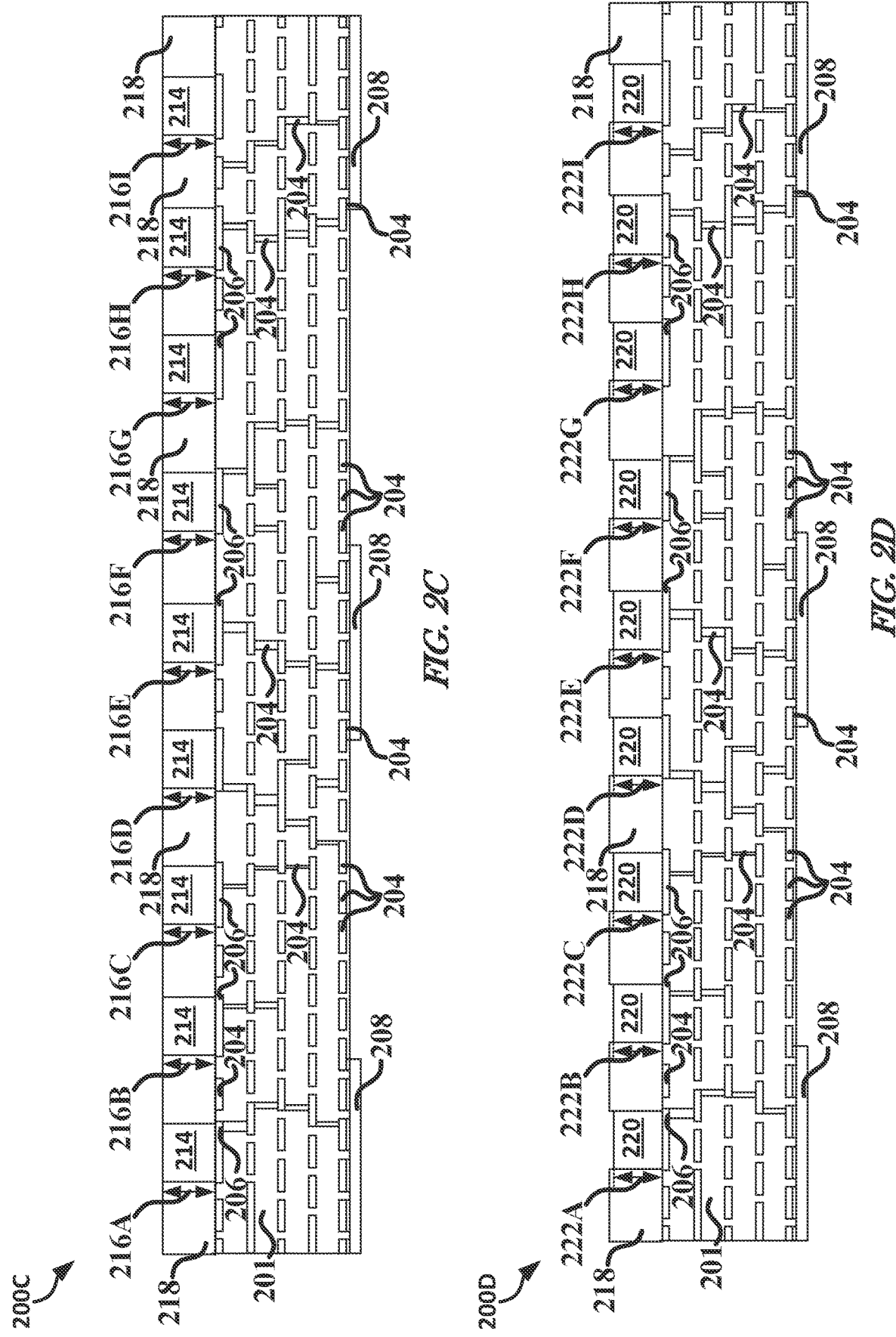

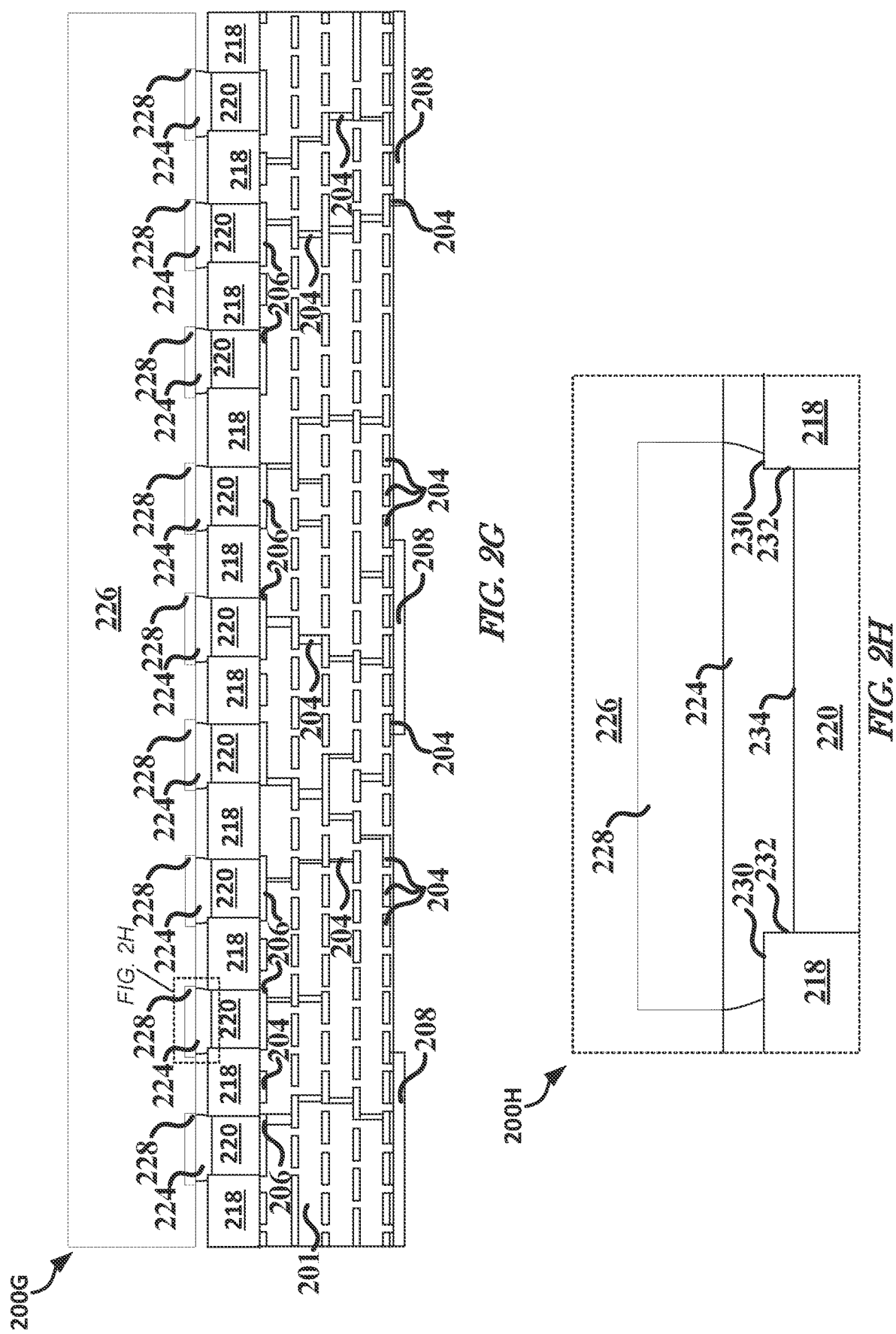

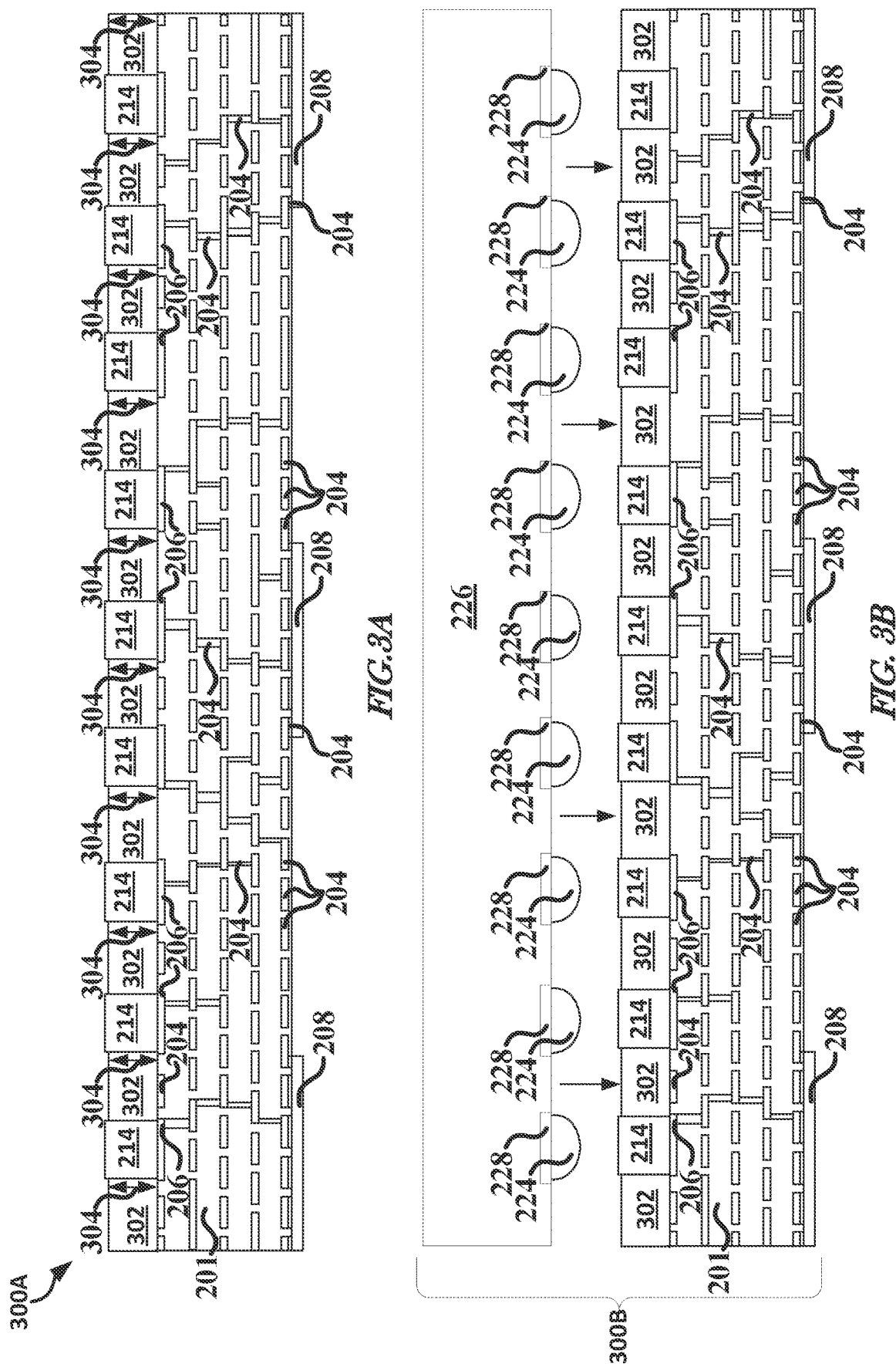

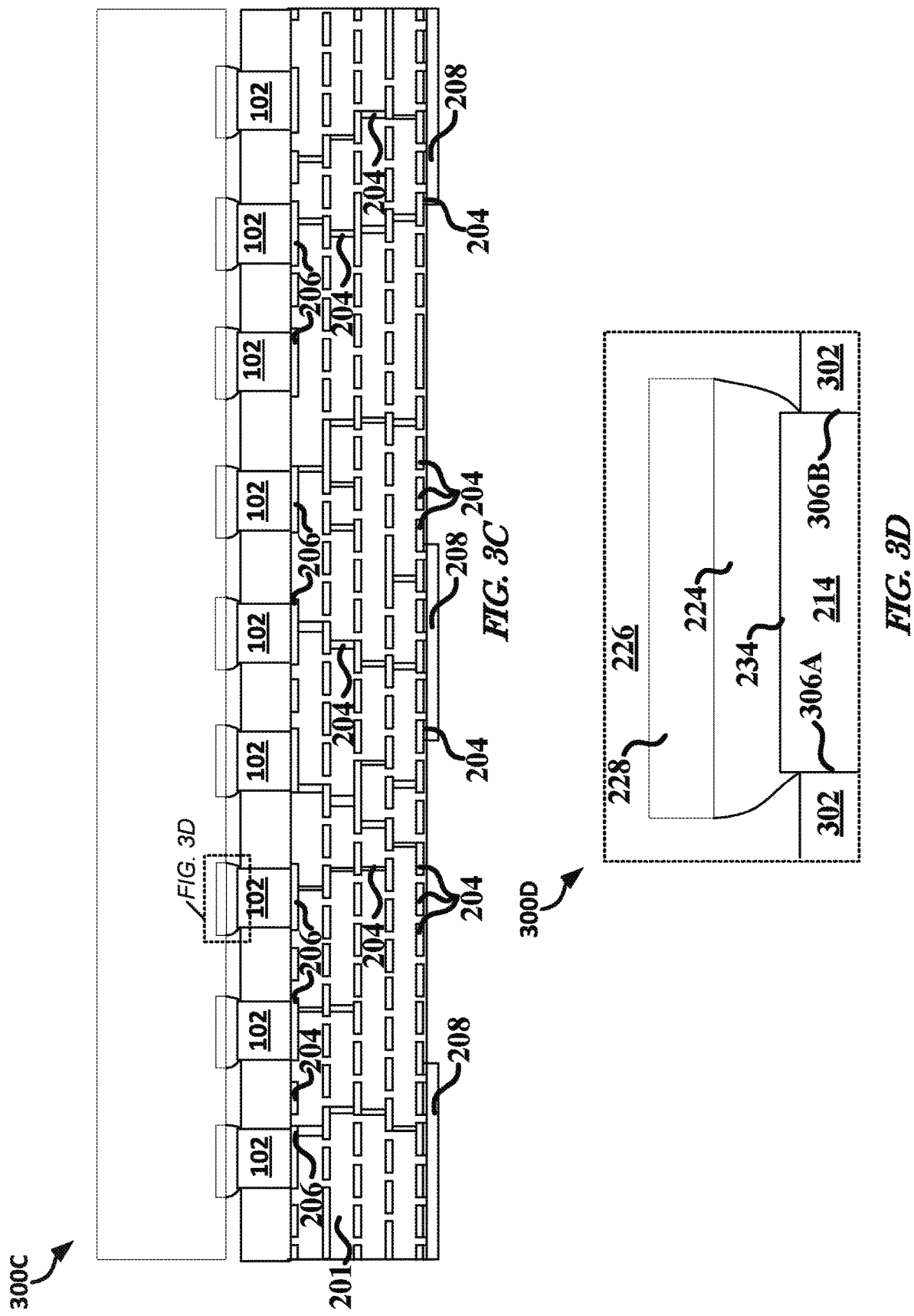

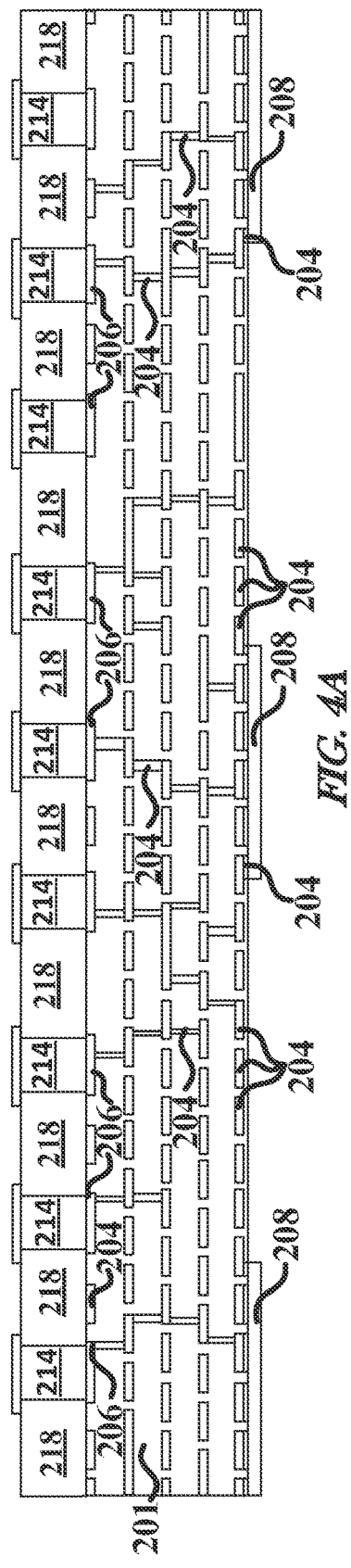
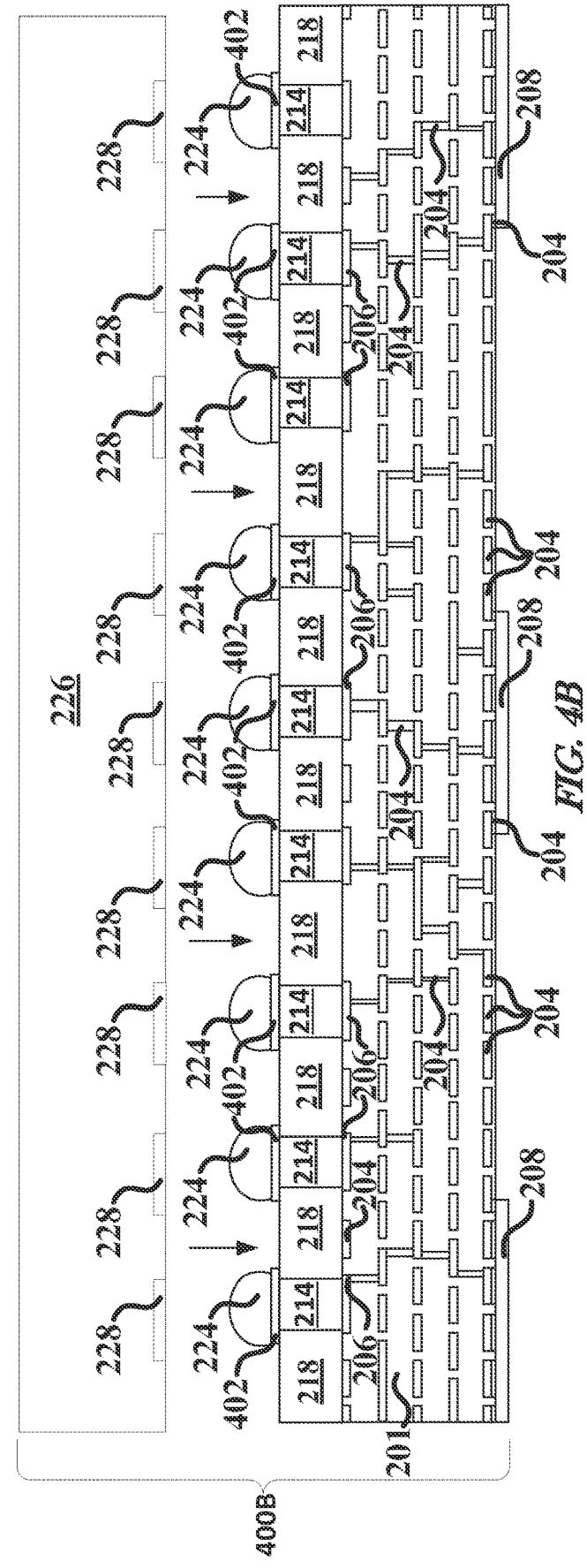
FIG. 4A
FIG. 4B

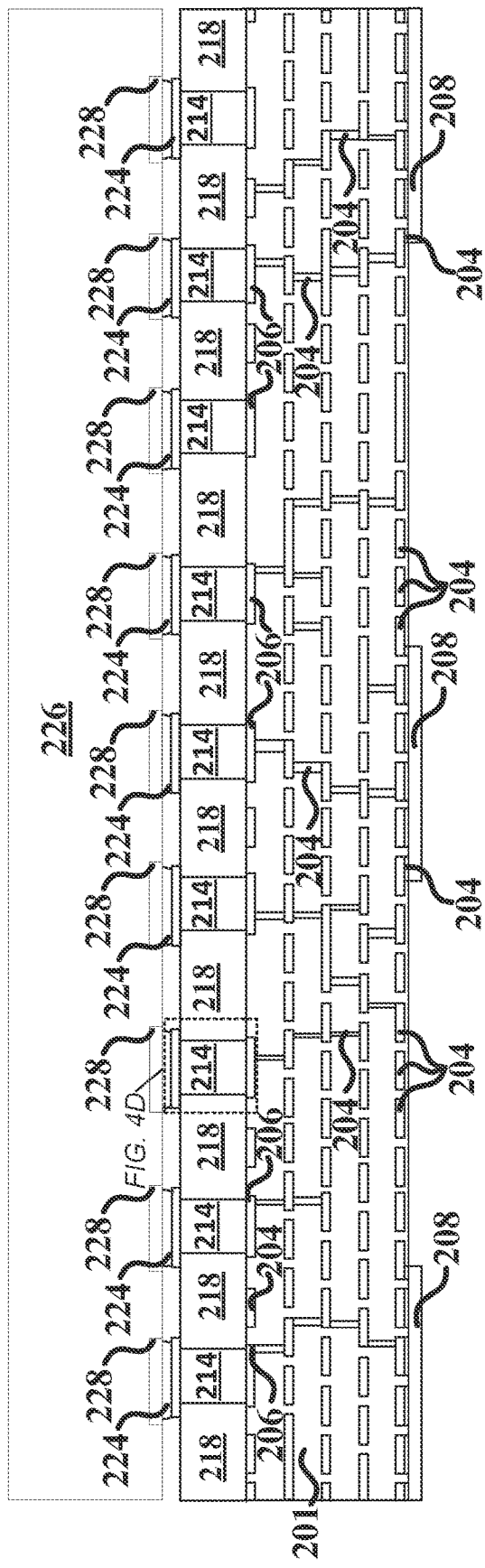
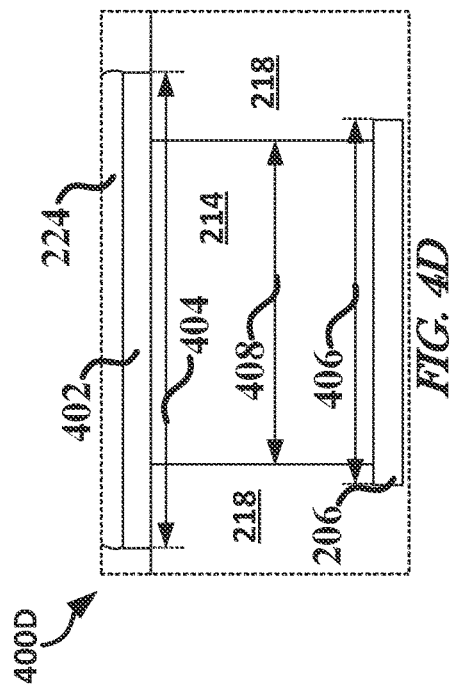
FIG. 4C
FIG. 4D

PLANAR INTEGRATED CIRCUIT PACKAGE INTERCONNECTS

CROSS-REFERENCE TO RELATED APPLICATION

This patent application is a continuation of U.S. patent application Ser. No. 16/842,954, filed Apr. 8, 2020, which is a continuation of U.S. application Ser. No. 15/198,107, filed Jun. 30, 2016, each of which is incorporated by reference herein in its entirety.

TECHNICAL FIELD

Examples generally relate to integrated circuit (IC) packages, and more specifically to processes for creating an IC package that includes generally planar conductive columns and the devices resulting from such processes.

TECHNICAL BACKGROUND

IC package technology has a tendency to move towards making ICs smaller and smaller. The smaller IC packages generally include more signal routing per unit area than larger IC packages. Manufacturing such smaller packages can be challenging. Smaller packages can include a higher yield loss than larger packages.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 2A-2H illustrate, by way of example, cross-section diagrams of stages of an example of a process of creating an IC package.

FIGS. 3A-3D illustrate, by way of example, cross-section diagrams of stages of an example of another process for creating an IC package.

FIGS. 4A-4D illustrate, by way of example, cross-section diagrams of stages of an example of another process for creating an IC package.

DESCRIPTION OF EMBODIMENTS

Figure 1:
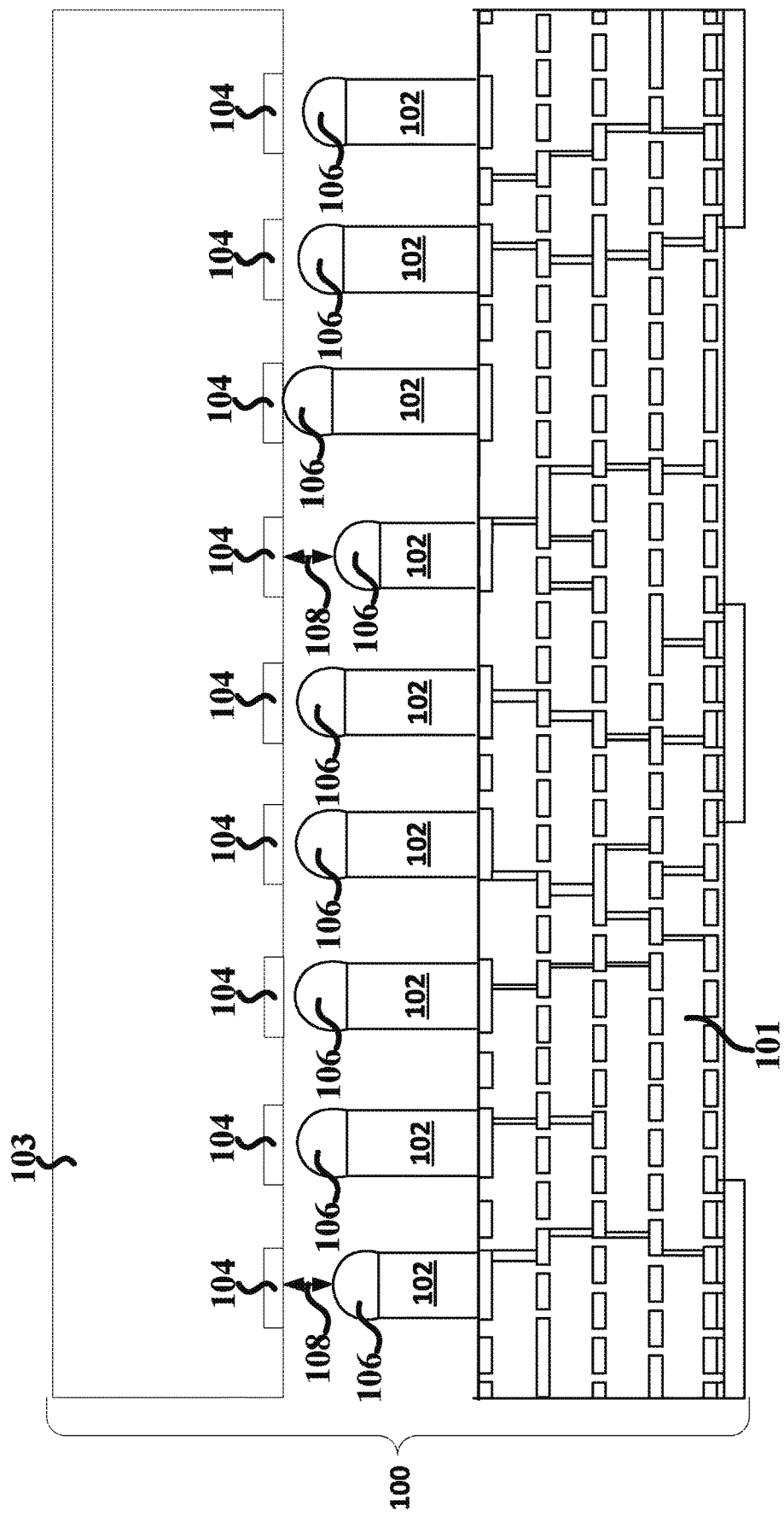
FIG. 1 illustrates, by way of example, a cross-section diagram of an example of an IC package.

Examples in this disclosure relate to processes for creating IC packages with conductive pillars that are generally planar (e.g., to within about five (5) um of each other or less). Examples also relate to apparatuses and systems created using such processes.

The following description includes terms, such as upper, lower, first, second, etc. that are used for descriptive purposes only and are not to be construed as limiting. The examples of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials.

As IC package interconnects (e.g., flip chip or other interconnects) continue to scale to finer pitches, the ability of the solder used in/on an interconnect to provide room for random or systematic fluctuations in bump height or surface co-planarity becomes more limited. Discussed herein are processes for creating an IC package with conductive pillars that are generally co-planar. The generally co-planar conductive pillars can help increase manufacturing yields, such as by reducing a variation in a gap between the conductive pillar and a chip to be attached to the pillar. The generally co-planar conductive pillars can help make pitch scaling more feasible. Finer pitches can be tolerated due to the more predictable gap distance between a respective conductive pillar and a pad to which the conductive pillar is to be connected.

In a high level summary, the process can include creating a conductive pillar (e.g., about forty (40) um tall in some manufacturing processes) on each bump location on a surface of a package substrate. The substrate can be covered with a mold compound thicker than the height of the conductive pillar, such that the mold compound extends beyond and covers the conductive pillar. The conductive pillars can then be exposed, such as through a controlled grinding process that can remove a specified amount of the mold (e.g., several microns of the mold). After grinding, conductive adhesive material (e.g., a solder ball, solder, or paste, among others) can be attached to the pillar or the pillar can be capped with a patterned pad and then the conductive adhesive can be added to the pad. A die can then be attached to the conductive pillars, such as through the conductive adhesive material.

Current substrate conductive pillar co-planarity combined with current substrate warpage can result in height variations between about ten (10) um and twenty (20) um across a die attach area on a package. This variation makes chip attach difficult and can negatively impact package yields. This variation also compromises advantages in die placement precision and accuracy achieved by a thermocompression bonding (TCB) tool. Embodiments discussed herein can help create absolute height variations less than (or equal to) five (5) um across the surfaces of conductive pillars. Such co-planarity can help enable a high yielding TCB chip attach process, such as at pitches of less than one hundred thirty (130) um. Further, such co-planarity can help reduce the size of the substrate landing pad under the conductive pillars. Reducing the size of the landing pad can help increase I/O routing density, such as without modifying a substrate patterning process.

Reference will now be made to the drawings wherein like structures will be provided with like suffix reference designations. In order to show the structures of various examples clearly, the drawings included herein are diagrammatic representations of integrated circuit structures. Thus, the actual appearance of the fabricated structures, for example in a photomicrograph, may appear different while still incorporating subject matter of the illustrated examples. Moreover, the drawings show the structures to aid in understanding the illustrated examples.

FIG. 1 illustrates, by way of example, a cross-section diagram of an embodiment of an integrated circuit (IC) package 100 prior to attaching a die 103 to a substrate 101. Variation in height of conductive pillars 102 on the substrate 101 causes gaps 108 to form between a conductive ball 106 and a contact pad 104 of the die 103. The gaps 108 can cause electrical shorts, such as where the conductive ball 106, after reflow, does not span the entirety of the gap 108. The gaps 108 can cause the die 103 to be misaligned, such as by causing a shift or rotation in the die 103 relative to the substrate 101 after the die 103 is situated on one or more of the conductive bumps 106.

Figure 2A:
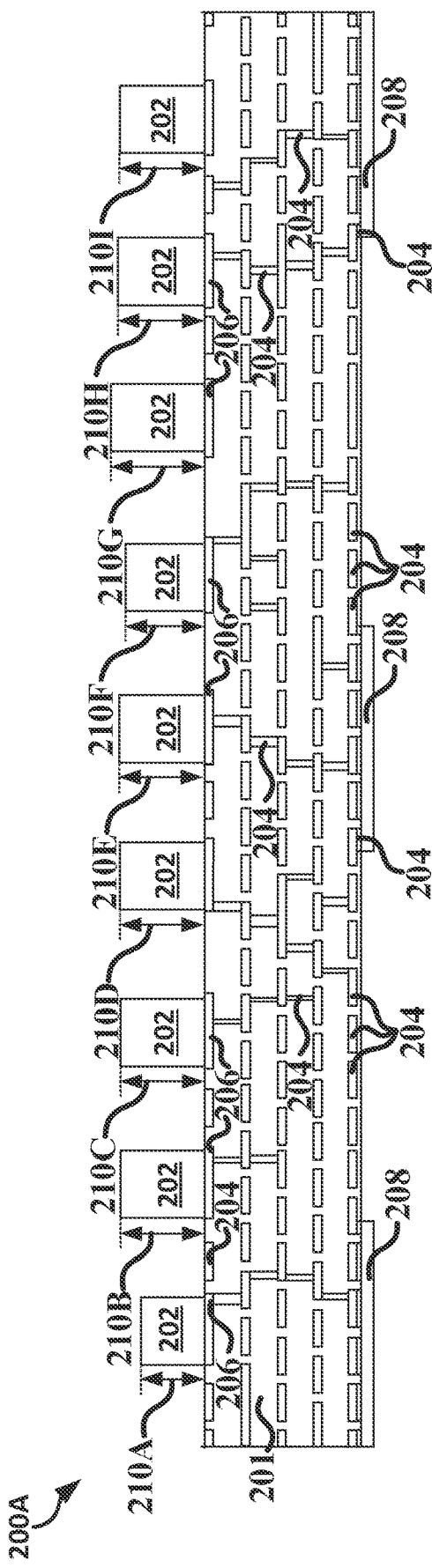

FIG. 2A illustrates, by way of example, a cross-section diagram of an embodiment of a device 200A. The device 200A as illustrated includes a substrate 201 with conductive pillars 202 situated on landing pads 204 of the substrate 201. The device 200A as illustrated includes interconnect circuitry 204 in and/or on the substrate 201. The device 200A as illustrated includes a landing pad 206 electrically connected to the interconnect circuitry 204 and on the substrate 201. The device 200A as illustrated includes a conductive pad 208, such as can be electrically and mechanically connected to a circuit, such as to electrically connect the device 200A to the circuit.

In one or more embodiments, the substrate 201 can include a bumpless buildup layer (BBUL) substrate or other substrate. The substrate 201 can be built-up by situating a dielectric (e.g., an Ajinomoto buildup film (ABF), patterning the dielectric, adding conductive material to the patterned dielectric, patterning the conductive material, and repeating until the substrate is built. Generally, any number of buildup layers can be used in creating the substrate 201 and the layers can be of a variety of thicknesses.

The conductive pillars 202 generally are made of copper, but can include other conductive material, such tin, cadmium, gold, silver, palladium, rhodium, copper, bronze, brass, lead, nickel silver, beryllium copper, nickel, combinations thereof, or the like. The conductive pillars 202 can be created by situating a thin seed layer of conductive material on the substrate, patterning the seed layer with photoresist, etching openings over each conductive pillar location, plating conductive material in the openings in the photoresist, removing the photoresist, and then etching the seed layer that was protected by the photoresist (e.g., where the conductive pillars are not present).

The conductive pillars 202 each include a respective height 210A, 210B, 210C, 210D, 210E, 210F, 210G, 210H, and 210I. A difference in the heights 210A-H can cause chip attach problems in later processing, such as is described with regard to FIG. 1, among others. To help alleviate the problems with the chip attach, it can be beneficial to make the heights 210A-H more uniform, such as to reduce a distance between a conductive ball on the conductive pillar and an exposed surface of a contact pad of a die to be attached to the conductive pillar (see FIGS. 2E and 2F).

The conductive pillars 202 can be grown to include a height that is greater than a final height of the pillars, such as to allow the conductive pillars 202 to be planarized prior to die attach. In one or more embodiments, the conductive pillars 202 can be grown to be thirty (30) um or greater in height. Some embodiments may include conductive pillars that are shorter than 30 um.

The interconnect circuitry 204 can provide electrical pathways through the substrate 201. The interconnect circuitry 204 can provide an electrical pathway for current to flow between a die attached to conductive pillars 202 and contact pads 208. The interconnect circuitry 204 can include electrical routing, such as can include, traces, planes, redistribution layer interconnect circuitry, vias, contact pads, or the like. The interconnect circuitry 204 can include conductive material, such as conductive material previously discussed with regard to the conductive pillars 202.

The landing pads 206 are electrically connected to the interconnect circuitry 204. The landing pads 206 can be made of conductive material, such as conductive material previously discussed with regard to the conductive pillars. The landing pads 206 provide a location at which to electrically and mechanically connect a conductive pillar 202 to the interconnect circuitry 204.

The contact pads 208 are electrically connected to the interconnect circuitry 204. The contact pads 208 provide electrical signals from the interconnect circuitry 204 to an external device (e.g., a printed circuit board (PCB), such as a flexible or rigid PCB, another package, a die, or other device). The contact pads 208 can include conductive material, such as conductive material previously discussed with regard to the conductive pillars 202.

Figure 2B:
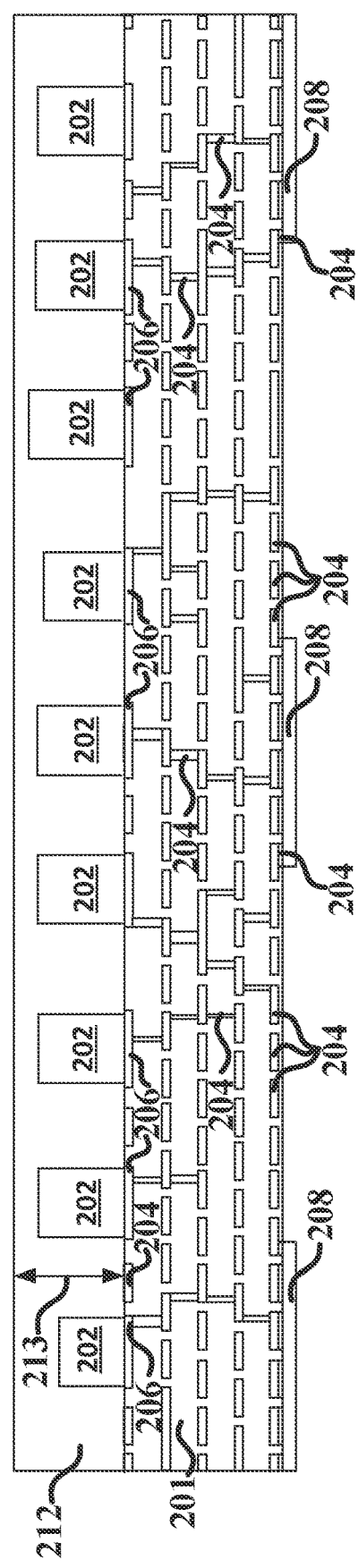

FIG. 2B illustrates, by way of example, a cross-section diagram of an embodiment of a device 200B that includes the device 200A after a molding material 212 is situated on the substrate 201 and the conductive pillars 202. The molding material 212 can be situated over and around exposed portions of the conductive pillars 202, the substrate 201, and/or the landing pads 206. A height 213 of the molding material 212 can be greater than a height of the tallest conductive pillar 202 (e.g., greater than height 210H in the example of the device 200A). The molding material 212 can include a polymer, prepreg, and/or a material that is photo-imagable (i.e. a material that can be removed using a photo-imaging process), such as polyimide. The mold material 212 can be chosen based on chemical, electrical, mechanical, or manufacturing properties of the mold material 212. The molding material 212 is generally a dielectric insulator.

FIG. 2C illustrates, by way of example, a cross-section diagram of an embodiment of a device 200C that includes the device 200B after the molding material 212 and the conductive pillars 202 are ground. Grinding the conductive pillars 202 forms conductive pillars 214 with more uniform heights 216A, 216B, 216C, 216D, 216E, 216F, 216G, 216H, and 216I than the conductive pillars 202 (i.e. the heights 210A-I). The grinding forms a molding material 218 that includes a height (generally the same as the heights 216A-I) that is less than the height 213 of the molding material 212. The grinding can include a mechanical grinding. The heights of the molding material 218 and the conductive pillar 214 can be generally uniform (e.g., within about 5 um of uniform) after the grinding process. That is a maximum height variation between any two points across the surface that was ground is at most 5 um.

FIG. 2D illustrates, by way of example, a cross-section diagram of an embodiment of a device 200D that includes the device 200C after a soft etch (e.g., a chemical etch) has removed a portion of the conductive pillars 214 to form the pillars 220. The amount of material removed from the conductive pillars 214 can be controlled by an amount of time the conductive pillars 214 are exposed to a chemical and/or a concentration of the etching agent in the chemical. A height 222A, 222B, 222C, 222D, 222E, 222F, 222G, 222H, and 222I of the conductive pillars 220 is less than the respective height 216A-I of the conductive pillars 214. The height 222A-I of the conductive pillars 220 is less than the height of the molding material 218, which is generally the same as the height 216A-I.

Reducing the height of the conductive pillar 220 can introduce greater variation in the co-planarity of the conductive pillars 220, but generally does not affect the co-planarity of the molding material 218. Reducing the height of the conductive pillars 214 can recess the conductive pillars 220, such that they include a height 222A-I that is less than a height of the molding material 218. Reducing the height of the conductive pillars 214 can help increase a bond strength between a conductive adhesive (see FIG. 2E) and the conductive pillar 220.

Figure 2E:
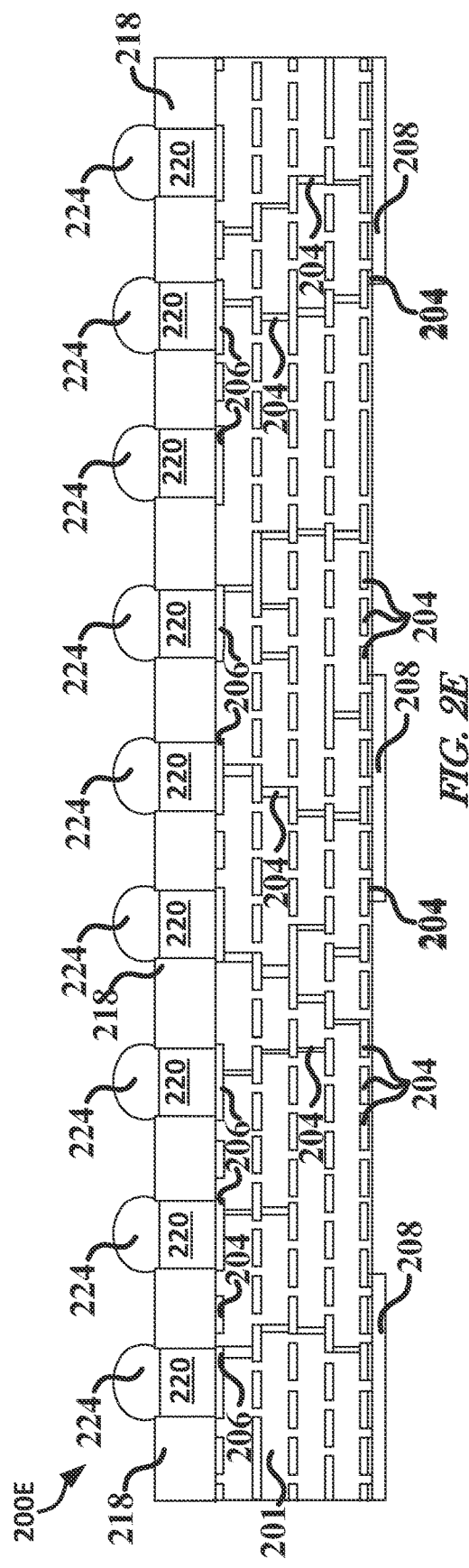

FIG. 2E illustrates, by way of example, a cross-section diagram of an embodiment of a device 200E that includes the device 200D after conductive adhesive 224 has been situated on and connected to the conductive pillars 220. The soft etch of the conductive pillars 214 can remove oxidation or other material from a contact surface of the conductive pillars 214, such as to form conductive pillars with a surface that is more amenable to forming a reliable electrical and/or mechanical connection with the conductive adhesive 224. The conductive adhesive 224 will form an electrical connection between the conductive pillars 220 and interconnect circuitry of a die (see FIG. 2F). The conductive adhesive 224 can include solder (e.g., solder balls), a conductive paste, or other conductive material that can form an electrical and mechanical bond between the conductive pillars 220 and contact pads of the die (see FIG. 2F). The conductive adhesive 224 can be situated by forming a mask that cover the molding material 218 and leaves the conductive pillars 220 exposed. The conductive adhesive 224 can be situated on the exposed conductive pillars 220 through the holes in the mask. The conductive adhesive 224 can be heated, such as to flow or at least partially cure the conductive adhesive 224 and bond the conductive adhesive 224 to the conductive pillar 220.

Figure 2F:
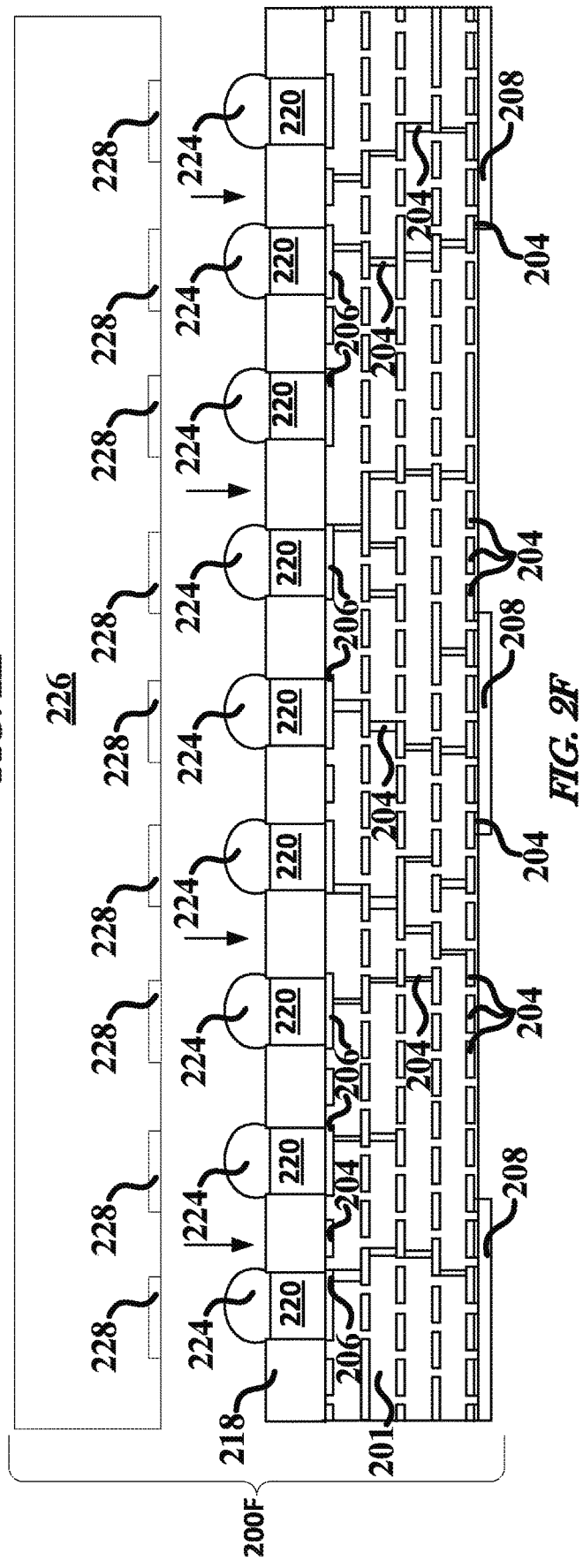

FIG. 2F illustrates, by way of example, a cross-section diagram of an embodiment of a device 200F that includes the device 200E as a die 226 is being situated on the conductive adhesive 224. The conductive adhesive 224 can be softened, such as by heating the conductive adhesive 224, and hardened to form an electrical and mechanical connection between a contact pad 228 of the die 226 and the conductive pillars 220. FIG. 2G illustrates, by way of example, a cross-section diagram of an embodiment of an IC package 200G that includes the device 200F after the die 226 is electrically and mechanically connected to the conductive pillars 220 through the conductive adhesive 224.

FIG. 2H illustrates, by way of example, an exploded view diagram of the dashed box labelled "FIG. 2H" in FIG. 2G. The conductive adhesive 224 is on the conductive pillar 220. The conductive adhesive 224 is over and in contact with a top surface 230 of the mold material 218. The conductive adhesive 224 fills the area that was occupied by the conductive pillar 214 prior to the soft etch. The conductive adhesive lines a portion of a sidewall 232 that extends beyond a top surface 234 of the conductive pillar 220.

FIG. 3A illustrates, by way of example, a cross-section diagram of an embodiment of a device 300A that includes the device 200C depicted in FIG. 2C after some of the molding material 218 is removed to form the molding material 302. The molding material 302 has a height 304 that is less than the height 216A-I. The molding material 218 can be removed using photo-imaging, laser ablation, or other process. The molding material 302 can be recessed in embodiments in which the conductive adhesive 224 is attached to the die 226 prior to electrically and mechanically connecting the die 226 to the substrate 201, such as through the conductive pillars 214.

FIG. 3B illustrates, by way of example, a cross-section diagram of an embodiment of a device 300B that includes the device 300A as a die 226 and the conductive adhesive 224 are being situated thereon. The conductive adhesive 224 can be softened, such as by heating the conductive adhesive 224, and hardened to form an electrical and mechanical connection between a contact pad 228 of the die 226 and the conductive pillars 214. FIG. 3C illustrates, by way of example, a cross-section diagram of an embodiment of an IC package 300C that includes the device 300B after the die 226 is electrically and mechanically connected to the conductive pillars 214 through the conductive adhesive 224.

FIG. 3D illustrates, by way of example, an exploded view diagram of the dashed box labelled "FIG. 3D" in FIG. 3C. The conductive adhesive 224 is on the conductive pillar 214. The conductive adhesive 224 is on and in contact with sidewalls 306A and 306B of the conductive pillar 214. The conductive adhesive 224 fills the area that was occupied by the conductive pillar 214 prior to the soft etch. The conductive adhesive 224 extends beyond the sidewalls 306A-B of the conductive pillar 214, such as to overhang the conductive pillar 224.

FIG. 4A illustrates, by way of example, a cross-section diagram of an embodiment of a device 400A that includes the device 200C depicted in FIG. 2C after a contact pads 402 are formed on respective conductive pillars 214. The contact pads 402 can be used in, for example, instances in which a width 408 (see FIG. 4D) of the conductive pillar 214 is too small to support a direct connection to the conductive adhesive 224. The contact pad 402 can be created by situating a layer of conductive material on the conductive pillars 214 and molding material 218, a patterned mask can then be situated on the conductive material, the conductive material can be etched and the mask can be removed. A width 404 of the contact pad 402 can be greater than a width 406 of the landing pad 206. Having a narrower landing pad width 406 can help increase I/O density in the substrate 101.

FIG. 4B illustrates, by way of example, a cross-section diagram of an embodiment of a device 400B that includes the device 400A after a conductive adhesive 224 is situated on respective contact pads 402 and as a die 226 being situated on the conductive adhesive. The conductive adhesive 224 can be softened, such as by heating the conductive adhesive 224, and hardened to form an electrical and mechanical connection between a contact pad 228 of the die 226 and the contact pad 402. FIG. 4C illustrates, by way of example, a cross-section diagram of an embodiment of an IC package 400C that includes the device 400B after the die 226 is electrically and mechanically connected to the conductive pillars 214 through the conductive adhesive 224 and the contact pad 402.

FIG. 4D illustrates, by way of example, an exploded view diagram of the dashed box labelled "FIG. 3D" in FIG. 3C. The conductive adhesive 224 is on the conductive pillar 214. The conductive adhesive 224 is on and in contact with sidewalk 306A and 306B of the conductive pillar 214. The conductive adhesive 224 fills the area that was occupied by the conductive pillar 214 prior to the soft etch. The conductive adhesive 224 extends beyond the sidewalls 306A-B of the conductive pillar 214, such as to overhang the conductive pillar 224.

Figure 5:
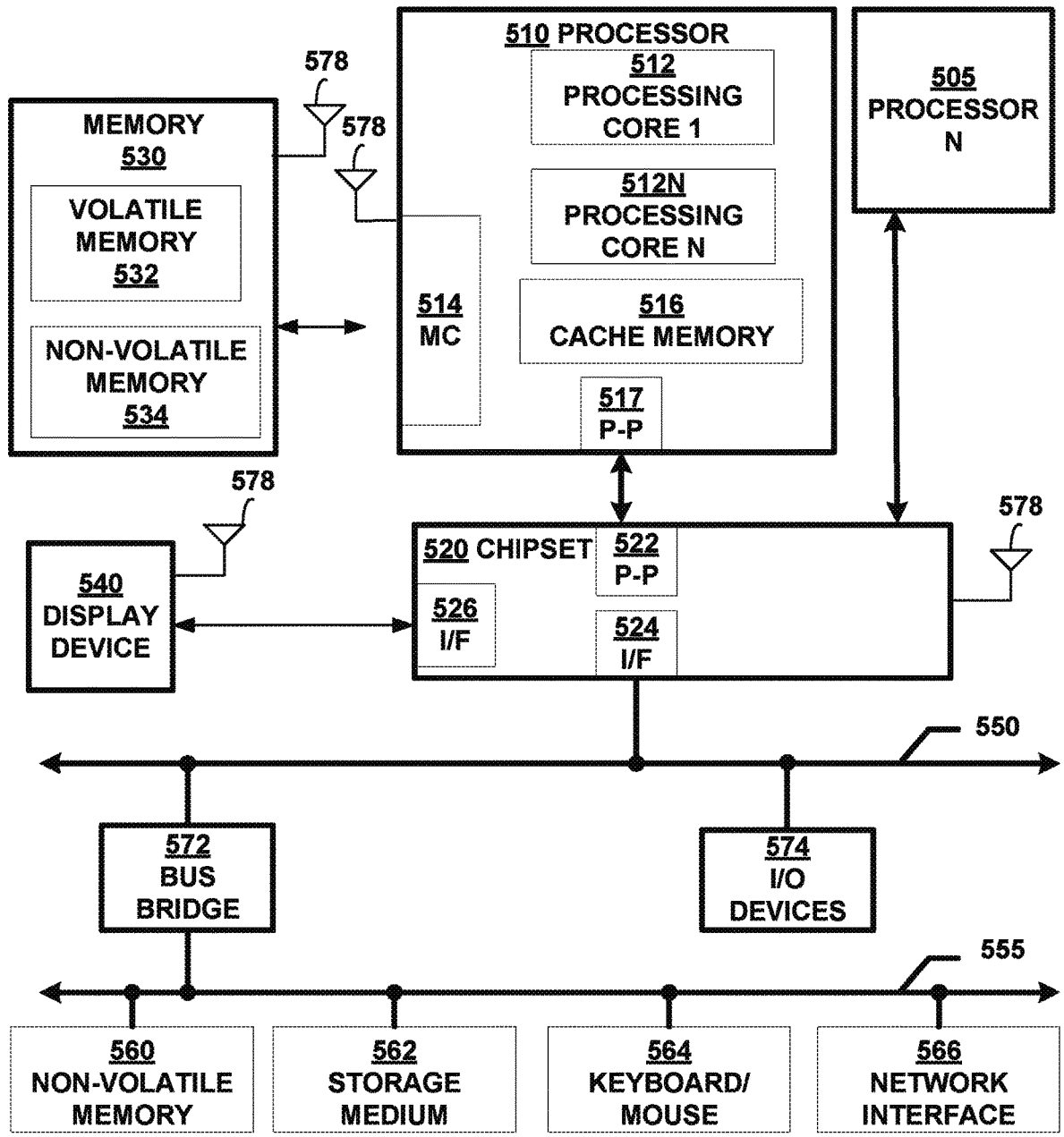
FIG. 5 illustrates, by way of example, a schematic diagram of an example of an electronic system.

FIG. 5 illustrates, by way of example, a logical block diagram of an embodiment of system 500. In one or more embodiments, system 500 includes one or more components that can include a package with planar interconnects as discussed herein.

In one embodiment, processor 510 has one or more processing cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520 couples with a non-volatile memory 560, a mass storage device(s) 562, a keyboard/mouse 564, and a network interface 566 via interface 524 and/or 504, etc.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UVB), Bluetooth, WiMax, or any form of wireless communication protocol. While the components shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

EXAMPLES AND NOTES

The present subject matter may be described by way of several examples.

In Example 1 a method of making an integrated circuit package includes growing conductive pillars on respective exposed landing pads of a substrate, situating molding material around and on the grown conductive pillars, removing, simultaneously, a portion of the grown conductive pillars and the molding material to make the grown conductive pillars and the molding material about planar, and electrically coupling a die to the conductive pillars.

In Example 2, Example 1 can further include after removing the portion of the grown conductive pillars and the molding material, removing another portion of the conductive pillars to recess the conductive pillars in the molding material.

In Example 3, Example 2 can further include, wherein removing another portion of the conductive pillars includes etching the conductive pillars.

In Example 4, Example 2 can further include situating conductive adhesive on each of the conductive pillars before electrically connecting the die to the substrate.

In Example 5, Example 4 can further include, wherein electrically connecting the die to the conductive pillars includes reflowing the conductive adhesive to electrically connect a contact pad of the die to a respective conductive pillar of the conductive pillars.

In Example 6, Example 5 can further include, wherein the conductive adhesive, after reflowing, lines a portion of sidewalls and a portion of a surface of the molding material.

In Example 7, at least one of Examples 1-6 after removing the portion of the grown conductive pillars and the molding material, removing another portion of the molding material to recess the molding material relative to the conductive pillars.

In Example 8, Example 7 can further include, wherein removing another portion of the molding material includes photo-imaging the molding material.

In Example 9, Example 7 can further include situating conductive adhesive on the die before electrically connecting the die to the substrate.

In Example 10, Example 9 can further include, wherein electrically connecting the die to the conductive pillars includes reflowing the conductive adhesive to electrically connect a contact pad of the die to a respective conductive pillar of the conductive pillars.

In Example 11, Example 10 can further include, wherein the conductive adhesive, after reflowing, lines exposed portions of side-walls of the conductive pillars.

In Example 12, at least one of Examples 1-11 can further include after removing the portion of the grown conductive pillars and the molding material, forming contact pads on respective conductive pillars.

In Example 13, Example 12 can further include, wherein forming the contact pads includes forming the contact pads to include a width greater than a width of the landing pads.

In Example 14, Example 13 can further include situating conductive adhesive on each of the contact pads before electrically connecting the die to the substrate.

In Example 15 an IC package includes a substrate comprising interconnect circuitry embedded in buildup layers and a plurality of landing pads exposed at a top surface thereof, a plurality of conductive pillars electrically connected to respective landing pads, a molding material around at least a portion of sidewall of the conductive pillars and on the substrate, and a die on the substrate, the die including contact pads electrically coupled to the interconnect circuitry through the conductive pillars, wherein the conductive pillars each include top surfaces that are generally planar with respect to one another to within a five micron deviation.

In Example 16, Example 15 can further include, wherein the contact pads of the die are first contact pads and the package further comprises second contact pads connected to respective conductive pillars, the second contact pads including a width greater than the landing pads, the second contact pads situated between the conductive pillars and the first contact pads.

In Example 17, Example 15 can further include, wherein the conductive pillars include a height that is greater than a height of the molding material and the IC package further comprises a conductive adhesive electrically connecting the first contact pads to the conductive pillars, wherein the conductive adhesive is in contact with sidewalls of the conductive pillars.

In Example 18, Example 15 can further include, wherein the conductive pillars include a height that is less than a height of the molding material and the IC package further comprises a conductive adhesive electrically connecting the first contact pads to the conductive pillars, wherein the conductive adhesive is in contact with sidewalls of the molding material.

In Example 19 a method of making an integrated circuit package can include growing copper pillars on respective exposed landing pads of a substrate, situating molding material around and on the grown copper pillars, removing, simultaneously, a portion of the grown copper pillars and the molding material to make the grown copper pillars planar with respect to each other to within a five micron deviation, and reflowing solder balls to electrically couple contact pads of the die to the copper pillars and to interconnect circuitry of the substrate.

In Example 20, Example 19 can further include after removing the portion of the grown copper pillars and the molding material, etching another portion of the copper pillars to recess the copper pillars in the molding material, attaching the solder balls to respective copper pillars before reflowing the solder balls, and wherein the solder balls after reflowing, line a portion of sidewalls and a portion of a surface of the molding material.

In Example 21, Example 19 can further include after removing the portion of the grown conductive pillars and the molding material, removing another portion of the molding material to recess the molding material relative to the conductive pillars.

In Example 22, Example 21 can further include, wherein removing another portion of the molding material includes photo-imaging the molding material.

In Example 23, Example 21 can further include situating conductive adhesive on the die before electrically connecting the die to the substrate.

In Example 24, Example 23 can further include, wherein electrically connecting the die to the conductive pillars includes reflowing the conductive adhesive to electrically connect a contact pad of the die to a respective conductive pillar of the conductive pillars.

In Example 25, Example 24 can further include, wherein the conductive adhesive, after reflowing, lines exposed portions of sidewalls of the conductive pillars.

In Example 26, Example 25 can further include after removing the portion of the grown conductive pillars and the molding material, forming contact pads on respective conductive pillars.

In Example 27, Example 26 can further include, wherein forming the contact pads includes forming the contact pads to include a width greater than a width of the landing pads.

In Example 28, Example 27 can further include situating conductive adhesive on each of the contact pads before electrically connecting the die to the substrate.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An integrated circuit (IC) package, comprising:
    a substrate comprising electrical pathways;
    landing pads at a surface of the substrate;
    conductive pillars electrically connected to respective landing pads, wherein heights of the conductive pillars are within five micrometers of one another; and
    a die comprising contact pads electrically coupled to the electrical pathways through the conductive pillars.

2. The IC package of claim 1, wherein the contact pads are first contact pads, the IC package further includes second contact pads coupled to respective conductive pillars, the second contact pads are between the conductive pillars and the first contact pads, and the second contact pads have widths greater than the respective landing pads.

3. The IC package of claim 2, further comprising an insulating material around at least portions of sidewalls of the conductive pillars, wherein the heights of the conductive pillars are greater than a height of the insulating material.

4. The IC package of claim 3, further comprising a conductive adhesive between the first contact pads and the conductive pillars, wherein the conductive adhesive is in contact with at least portions of the sidewalls of the conductive pillars.

5. The IC package of claim 2, further comprising an insulating material around at least portions of sidewalls of the conductive pillars, wherein the heights of the conductive pillars are smaller than a height of the insulating material.

6. The IC package of claim 5, further comprising a conductive adhesive between the first contact pads and the conductive pillars, wherein the conductive adhesive is in contact with portions of the insulating material.

7. The IC package of claim 1, wherein the heights of the conductive pillars are measured from the respective landing pads.

8. The IC package of claim 1, further comprising an insulating material around at least portions of sidewalls of the conductive pillars.

9. The IC package of claim 8, wherein the heights of the conductive pillars are greater than a height of the insulating material.

10. The IC package of claim 9, further comprising a conductive adhesive between the contact pads and the conductive pillars, wherein the conductive adhesive is in contact with at least portions of the sidewalls of the conductive pillars.

11. The IC package of claim 10, wherein the conductive adhesive is in electrically conductive contact with the contact pads.

12. The IC package of claim 8, wherein the heights of the conductive pillars are smaller than a height of the insulating material.

13. The IC package of claim 11, further comprising a conductive adhesive between the contact pads and the conductive pillars, wherein the conductive adhesive is in contact with portions of the insulating material.

14. A method of fabricating an integrated circuit package, the method comprising:
    forming conductive pillars on respective landing pads of a substrate;
    providing an insulating material around and on the conductive pillars;
    removing portions of the conductive pillars and the insulating material to make heights of the conductive pillars within five micrometers of one another; and
    providing a die electrically coupled to the conductive pillars.

15. The method of claim 14, wherein the method further includes recessing the conductive pillars in the insulating material.

16. The method of claim 14, wherein the conductive pillars are in direct contact with the respective landing pads.

17. An integrated circuit (IC) package, comprising:
    a substrate comprising electrical pathways;
    landing pads at a surface of the substrate;
    conductive pillars electrically connected to respective landing pads;
    a die comprising first contact pads electrically coupled to the electrical pathways through the conductive pillars; and
    second contact pads between the conductive pillars and the first contact pads and having widths greater than the respective landing pads.

18. The IC package of claim 17, wherein the second contact pads are coupled to respective conductive pillars.

19. The IC package of claim 17, wherein heights of the conductive pillars are within five micrometers of one another.

20. The IC package of claim 17, wherein the conductive pillars are coplanar to within a deviation of five micrometers.

* * * * *